(12) United States Patent
Kim et al.

(10) Patent No.: US 10,211,075 B2
(45) Date of Patent: Feb. 19, 2019

(54) APPARATUS AND METHOD FOR TREATING A SUBSTRATE

(71) Applicant: SEMES CO., LTD., Cheonan-si, Chungcheongnam-do (KR)

(72) Inventors: Dae Min Kim, Cheonan-si (KR); Soyoung Park, Hapcheon-gun (KR); Muhyeon Lee, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 3 days.

(21) Appl. No.: 15/440,288

(22) Filed: Feb. 23, 2017

(65) Prior Publication Data

US 2017/0274415 A1 Sep. 28, 2017

(30) Foreign Application Priority Data

Mar. 22, 2016 (KR) .................. 10-2016-0033909

(51) Int. Cl.
| | | |
|---|---|---|
| *B05D 1/00* | (2006.01) | |
| *B05D 1/02* | (2006.01) | |
| *B05D 1/34* | (2006.01) | |
| *B05D 1/36* | (2006.01) | |
| *B05D 3/00* | (2006.01) | |

(Continued)

(52) U.S. Cl.
CPC ........ *H01L 21/67051* (2013.01); *B05D 1/002* (2013.01); *B05D 1/005* (2013.01); *B05D 1/02* (2013.01); *B05D 1/34* (2013.01); *B05D 1/36* (2013.01); *B05D 3/002* (2013.01); *B05D 7/52* (2013.01); *B08B 3/00* (2013.01); *B08B 3/024* (2013.01); *B08B 3/04* (2013.01); *H01L 21/02041* (2013.01)

(58) Field of Classification Search
CPC .......... B05D 1/002; B05D 1/005; B05D 1/02; B05D 1/36; B05D 7/52; B05D 1/34; B05D 3/002; B08B 3/04; B08B 3/00; B08B 3/024; H01L 21/67051; H01L 21/02041
USPC ......... 427/240, 346, 407.1, 425, 299, 421.1, 427/427.3; 134/26, 95.3, 99.1
See application file for complete search history.

(56) References Cited

U.S. PATENT DOCUMENTS

2003/0084925 A1* 5/2003 Nakajima ........... B01F 3/04007
134/26
2009/0014033 A1* 1/2009 Tokuno ............. H01L 21/02052
134/18

FOREIGN PATENT DOCUMENTS

| JP | 2001-185523 A | 7/2001 |
|---|---|---|
| JP | 2003-209087 A | 7/2003 |

(Continued)

*Primary Examiner* — William P Fletcher, III
(74) *Attorney, Agent, or Firm* — Harness, Dickey & Pierce, P.L.C.

(57) ABSTRACT

An apparatus and a method for treating a substrate with liquid are disclosed. The substrate treating apparatus comprises a substrate supporting unit for supporting the substrate, a liquid supply unit for supplying a liquid to the substrate supported on the substrate supporting unit, and a controller for controlling the liquid supply unit, wherein the liquid supply unit comprises a first nozzle for supplying a first liquid and a second nozzle for supplying a second liquid, and a second area where the second liquid is supplied on the substrate is provided within a first area where the first liquid is supplied on the substrate. The first liquid and the second liquid supplied with a hydrophobic film are discharged with different ways from each other. Thereby, particles with various sizes may be removed depending on each discharge methods.

8 Claims, 5 Drawing Sheets

(51) Int. Cl.
*B05D 7/00* (2006.01)
*B08B 3/00* (2006.01)
*B08B 3/02* (2006.01)
*B08B 3/04* (2006.01)
*H01L 21/02* (2006.01)
*H01L 21/67* (2006.01)

(56) References Cited

FOREIGN PATENT DOCUMENTS

KR      2003-0038377 A     5/2003
KR    10-2014-0037977 A     3/2014

\* cited by examiner

APPARATUS AND METHOD FOR TREATING A SUBSTRATE

CROSS-REFERENCE TO RELATED APPLICATIONS

A claim for priority under 35 U.S.C. § 119 is made to Korean Patent Application No. 10-2016-0033909 filed Mar. 22, 2016, in the Korean Intellectual Property Office, the entire contents of which are hereby incorporated by reference.

BACKGROUND OF THE INVENTION

The present invention disclosed herein relates to an apparatus and method for treating a substrate with liquid.

In a method for manufacturing a flat panel display or a semiconductor device, a variety of processes such as photolithography process, an ashing process, an etching process, an ion injection process, a thin film deposition process, and a cleaning process are performed. The cleaning process removes particles remained in a substrate and is performed before and after each process.

The cleaning process is applied differently depending on the surface property of the substrate. Especially, when the substrate has hydrophobic property such as LK (Low-K), ULK (Ultra Low-K), and SiCN, it is hard to perform wet cleaning process for cleaning the substrate with liquid. Therefore, a gas cluster was formed like a dry cleaning apparatus described in the patent document 1 and a removing process and then performed removing process for removing particles attached in the substrate surface.

However, it has been found that the particles over 90 nm and smaller particles that were broken down thereof were reattached to the substrate surface according to the development of an analysis equipment and thereby it is hard to expect high efficiency of dry cleaning the substrate surface having hydrophobic property.

SUMMARY OF THE INVENTION

The present invention provides an apparatus and a method that may enhance cleaning efficiency to a substrate surface having hydrophobic property.

Also, the present invention provides an apparatus and a method for treating a substrate surface having hydrophobic property with wet cleaning.

An embodiment of the present invention provides an apparatus and a method for treating a substrate with liquid. The substrate treating apparatus comprises a substrate supporting unit for supporting the substrate, a liquid supply unit for supplying a liquid to the substrate supported on the substrate supporting unit, and a controller for controlling the liquid supply unit, wherein the liquid supply unit comprises a first nozzle for supplying a first liquid and a second nozzle for supplying a second liquid, and a second area where the second liquid is supplied on the substrate is provided within a first area where the first liquid is supplied on the substrate.

The first liquid and the second liquid are discharged with different ways from each other wherein the first area is provided as a liquid film and the second liquid may be discharged with a mist way. The controller may control the liquid supply unit for the first liquid and the second liquid to be supplied at the same time. The controller may control the liquid supply unit for the second liquid to be supplied after the first liquid is supplied. Each of the first liquid and the second liquid may be provided to remove particle generated from hydrophobic film formed on the substrate and may be provided as a liquid including an organic solvent. The liquid supply unit may further comprise a nozzle moving member for moving the first nozzle and the second nozzle, wherein the controller may control the nozzle moving member for the first area and the second area to be movable between an end of the substrate and the center of the substrate.

In a method for treating a hydrophobic film formed on a substrate with liquid, the substrate is treated with a liquid by supplying a first liquid and a second liquid on the substrate, wherein a second area where the second liquid is supplied on the substrate is provided within a first area where the first liquid is supplied on the substrate.

The first liquid and the second liquid are discharged with different ways from each other and a liquid film may be formed on the substrate by the first liquid, wherein the second liquid may be discharged with a mist way. The second liquid may be discharged on the liquid film. Each of the first liquid and the second liquid may be provided as a liquid including an organic solvent. The hydrophobic film may include one among Lk (Low-K), ULK (Ultra Low-K), and SiCN, wherein the organic solvent may include IPA.

According to an embodiment of the present invention, a liquid used in wet treatment of the hydrophobic film includes an organic solvent. The organic solvent is provided as a surfactant to the hydrophobic film and thereby may treat the hydrophobic film with wet cleaning.

Also according to an embodiment of the present invention, the first liquid and the second liquid supplied as the hydrophobic films are discharged with different ways from each other. Thereby, various sizes of particles may be removed depending on each of the discharge ways.

DETAILED DESCRIPTION

Various example embodiments will be described more fully hereinafter with reference to the accompanying drawings, in which some example embodiments are shown. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Therefore, features of the drawings are exaggerated to emphasize definite explanation.

An embodiment explains a process for cleaning a hydrophobic film formed on the substrate. Hereinafter explains the embodiment of the present invention in detail by referring to FIGS. 1 to 8.

Figure 1:
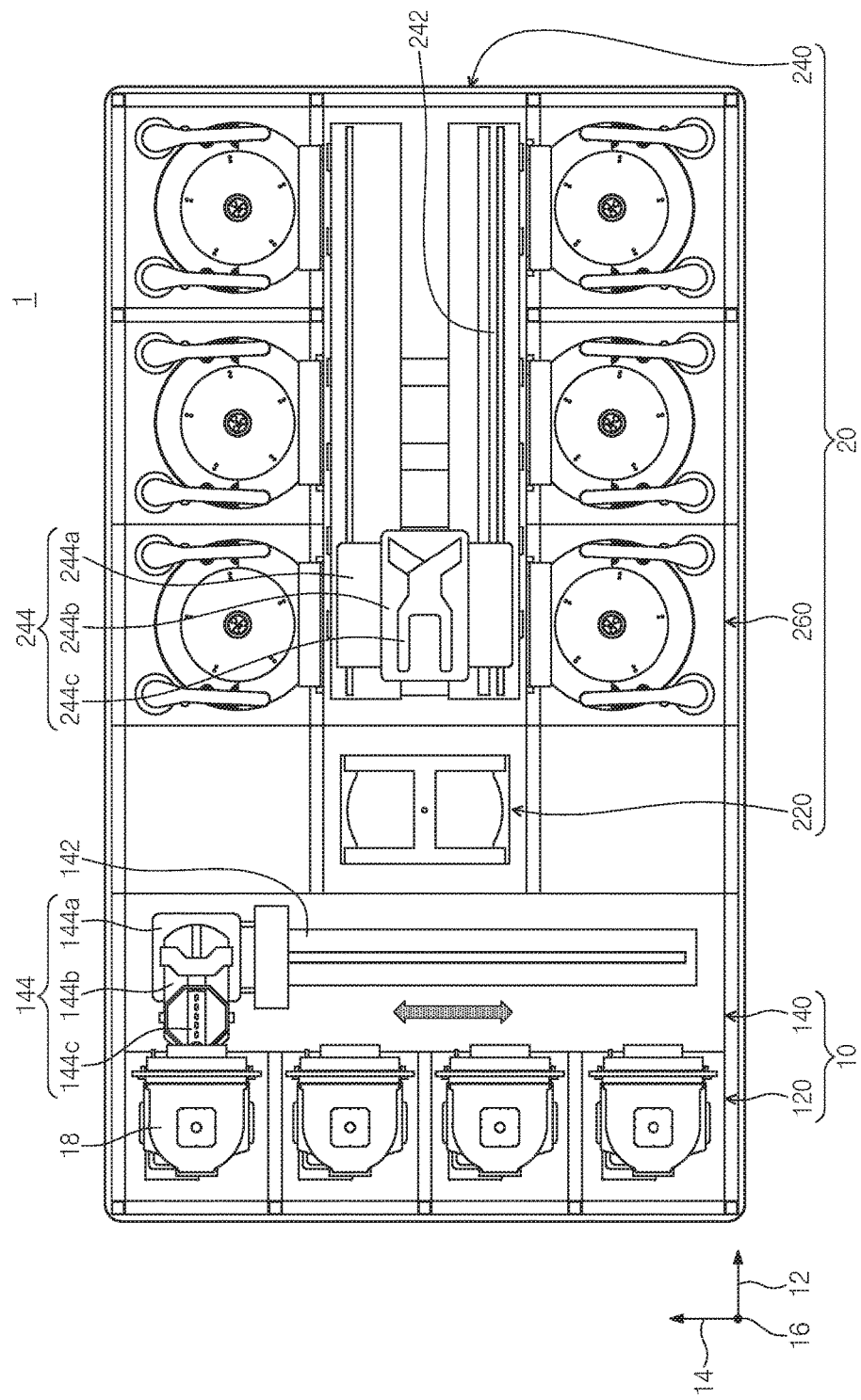
FIG. 1 is a plan view of a substrate treating apparatus in accordance with an embodiment of the present invention.

FIG. 1 is a plan view of a substrate treating apparatus in accordance with an embodiment of the present invention. Referring to FIG. 1, a substrate treating apparatus 1 comprises an index module 10 and a process treating module 20. The index module 10 have a load port 120 and a transfer frame 140. The load port 120, the transfer frame 140, and the process treating module 20 are sequentially arranged in a row. Hereinafter, a direction where the load port 120, the transfer frame 140, and the process treating module 20 are arranged is referred to as a first direction 12. And a direction perpendicular to the first direction 12 is referred to as a second direction 14, when view from a top side, and a direction perpendicular to a plane including the first direction 12 and the second direction 14 is referred to as a third direction 16.

A carrier 18 where a substrate W is stored is seated on the load port 120. The load port 120 is provided as a plurality of numbers and they are arranged in a row along the second direction 14. The number of load ports 120 may be increased or decreased depending on a requirement like process efficiency and a footprint of the process treating module 20. In the carrier 18, a plurality of slots (not described) are provided to store the substrates W arranged as parallel to the plane. A front opening unified pod (FOUP) may be used as the carrier 18.

The process treating module 20 comprises a buffer unit 220, a transfer chamber 240, and a process chamber 260. The transfer chamber 240 is provided such that the lengthwise direction thereof is parallel with the first direction 12. The process chambers 260 are provided in both sides of the transfer chamber 240. The process chambers 260 are provided symmetrically in both sides of the transfer chamber 240. Some of the process chambers 260 are placed along the lengthwise direction of the transfer chamber 240. Also, some of the process chambers 260 are placed vertically stacked to each other. That is, in one side of the transfer chamber 240, the process chambers 260 may be arranged in A×B array. Herein, A is the number of the process chambers 260 which are provided along the first direction 12, and B is the number of process chambers 260 which are provided along the third direction 16. When four or six process chambers 260 are provided on one side of the transfer chamber 240, the process chambers 260 may be arranged in 2×2 or 3×2 arrays. The number of the process chamber 260 may be increased or decreased.

Selectively, the process chamber 260 may be provided only on one side of the transfer chamber 240. Also, unlike described above, the process chamber 260 may be provided as a single layer at one side and both sides of the transfer chamber 240.

The buffer unit 220 is placed between the transfer frame 140 and the transfer chamber 240. The buffer unit 220 provides a space for the substrate W to stay temporarily before transferring the substrate W between the transfer chamber 240 and the transfer frame 140. The slot (not described) where the substrate places is provided inside of the buffer unit 220. The slots (not described) are provided with a plurality of numbers spaced apart from each other along the third direction 16. One side of the buffer unit 220 facing the transfer frame 140, and the other side of the buffer unit 220 facing the transfer chamber 240 are opened.

The transfer frame 140 transfers the substrate W between the buffer unit 220 and the carrier 18 seated on the load port 120. In the transfer frame 140, an index rail 142 and an index robot 144 are provided. The index rail 142 is provided such that the lengthwise direction is parallel to the second direction 14. The index robot 144 is installed on the index rail 142, and moves linearly along the index rail 142 to the second direction 14. The index robot 144 comprises a base 144a, a body 144b, and an index arm 144c. The base 144a is installed movably along the index rail 142. The body 144b is coupled to the base 144a. The body 144b is provided movably along the third direction 16 on the base 144a. Also, the body 144b is provided rotatable on the base 144a. The index arm 144c is coupled to the body 144b, and is provided to move front and back to the body 144b. The index arm 144c is provided with a plurality of numbers and they are driven independently. The index arms 144c are arranged vertically, i.e., spaced apart from each other along the third direction 16. Some of the index arms 144c may be used when transferring the substrate W from the process treating module 20 to the carrier 18, and some may be used when transferring the substrate W from the carrier 18 to the process treating module 20. In this way, during the index robot 144 carries in or carries out the substrate W, particles that have come from a substrate before treating process may be prevented from adhering to a substrate after treating process.

The transfer chamber 240 transfers the substrate W between process chamber 260 and the buffer unit 220 and between the process chambers 260. A guide rail 242 and a main robot 244 are provided in the transfer chamber 240. The guide rail 242 is placed such that the lengthwise direction is parallel with the first direction 12. The main robot 244 is installed on the guide rail 242, and moves linearly along the first direction 12 on the guide rail 242. The main robot 244 comprises a base 244a, a body 244b, and a main arm 244c. The base 244a is installed movably along the guide rail 242. The body 244b is coupled to the base 244a. The body 244b is provided movably along the third direction 16 on the base 244a. Also, the body 244b is provided rotatable on the base 244a. The main arm 244c is coupled to the body 244b, and is provided to move front and back to the body 244b. The main arm 244c is provided with a plurality of numbers and they are provided to drive separately. The main arms 244c are arranged vertically, i.e., spaced apart from each other along the third direction 16.

In the process chamber 260, a substrate treating apparatus 300 which performs a cleaning process to the substrate W is provided. The substrate treating apparatus 300 may have different structures based on kinds of cleaning process. The substrate treating apparatus 300 provided within the process chambers 260 may have the same structure. The process chambers 260 may be divided into a plurality of groups, and the substrate treating apparatus 300 provided in the same group of the process chamber 260 may have the same structure, and the substrate treating apparatus 300 provided in different group of the process chamber 260 may have different structure.

Figure 2:
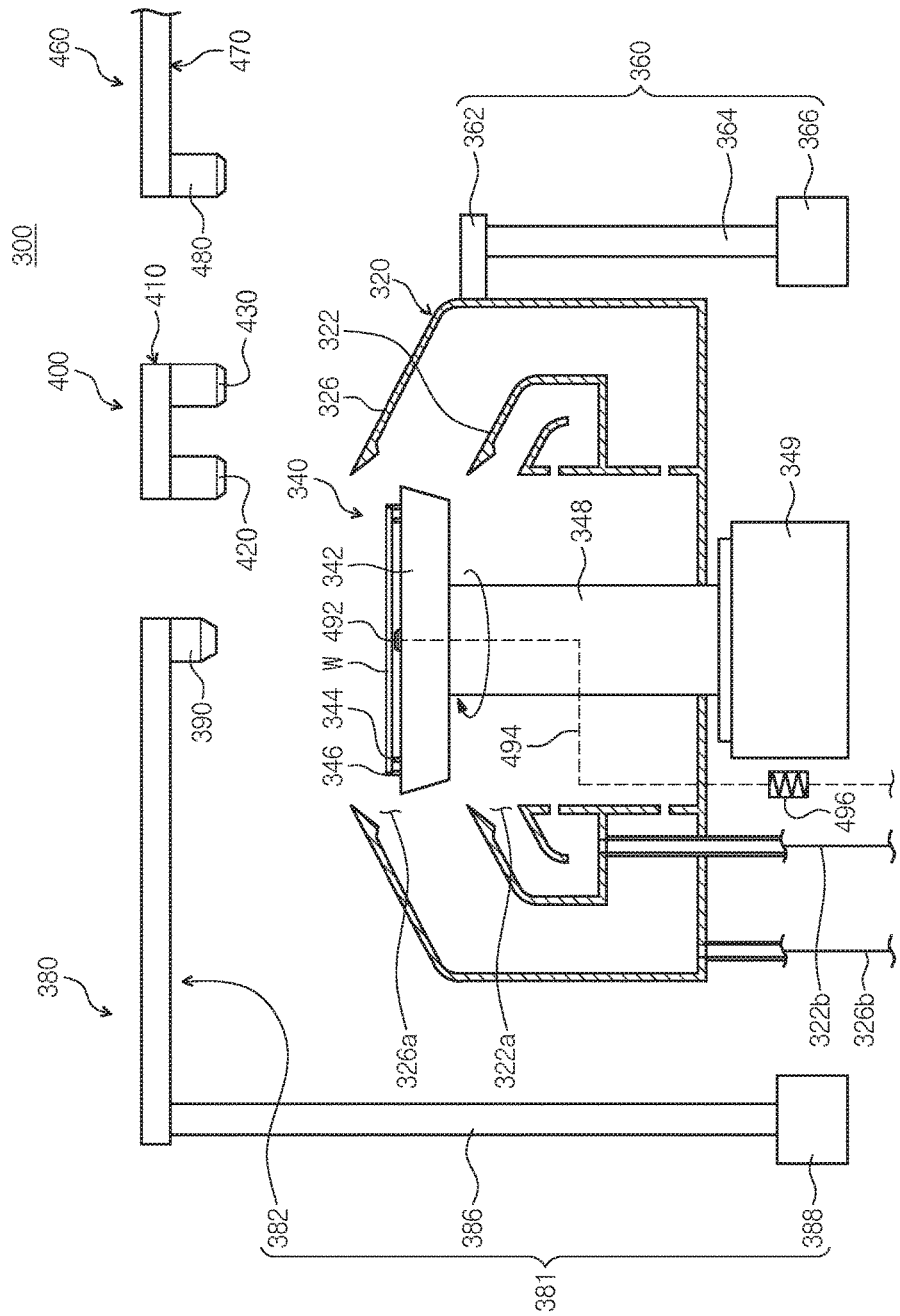
FIG. 2 is a cross sectional view of a substrate treating apparatus of FIG. 1.

The substrate treating apparatus 300 performs a process for treating a hydrophobic film formed on the substrate with a liquid. FIG. 2 is a cross sectional view of a substrate treating apparatus of FIG. 1. Referring to FIG. 2, the substrate treating apparatus 300 comprises a treating container 320, a spin head 340, an elevator unit 360, a liquid supply unit 380, and a controller 500.

The treating container 320 has open upper side container form. The treating container 320 comprises an inner collecting container 322 and an outer collecting container 326. Each collecting containers 322, 326 collects a treatment liquid that are different from each other among liquids used in a process. The inner collecting container 322 is provided as a ring shape surrounding the spin head 340 and the outer collecting container 326 is provided as a ring shape surrounding the inner collecting container 322. An inner space 322a of the inner collecting container 322 and the inner collecting container 322 may function as a first inlet 322a where treatment liquid flows therein. An interspace 326a between the inner collecting container 322 and the outer collecting container 326 may function as a second inlet 326a where treatment liquid flows therein. According to an embodiment, each inlet 322a, 326a may be placed in different heights from each other. In the collecting containers 322, 326, collecting lines 322b, 326b are connected which are extended vertically downward to the bottom, respectively. The emitted treatment liquid in the collecting containers 322, 326 may be reused as treatment liquid regeneration system (not described) of outside through the collecting lines 322b, 326b.

The spin head 340 is provided as the substrate supporting unit 340 for rotating and supporting the substrate W during substrate treating process. The spin head 340 comprises a body 342, a supporting pin 344, a chuck pin 346, and a supporting shaft 348. The body 342 has an upper surface usually provided as a circular form, when viewed from a top side. At the bottom of the body 342 the supporting shaft 348 rotatable by a motor 349 is fixedly connected.

The supporting pin 344 is provided with a plurality of numbers. The plurality of supporting pins 344 are spaced apart from each other on edge of the upper surface of the body 342 and protrude upward from the body 342. The supporting pins 344 are generally arranged to have a ring shape by combination of each other. The supporting pin 344 supports the back side edge of the substrate W as to be spaced apart from the upper surface of the body 342.

The chuck pin 346 is provided as a plurality number. The chuck pin 346 is arranged further apart from a center of the body 342 than the supporting pin 344. The chuck pin 346 is provided as to protrude upward from the body 342. The chuck pin 346 supports lateral part (side) of the substrate W such that the substrate W does not deviate from a right position to a side direction when the spin head 340 is rotating. The chuck pin 346 is provided to move linearly between standby position and supporting position along a radius direction of the body 342. The standby position is further apart from a center of the body 342 than the supporting position. When loading and unloading the substrate W on and from the spin head 340 the chuck pin 346 is placed on the standby position, and when processing the substrate W, the chuck pin 346 is placed on the supporting position. The chuck pin 346 on the supporting position is contacted with the lateral part of the substrate W.

The elevator unit 360 moves the treating container 320 linearly to up and down direction. As the treating container 320 moves up and down, a height of the treating container 320 relative to the spin head 340 is changed. The elevator unit 360 comprises a bracket 362, a moving shaft 364, and a driver 366. The bracket 362 is fixedly installed on outer wall of the treating container 320. The moving shaft 364 moving up and down direction by the driver 366 is fixedly coupled to the bracket 362. When the substrate W is placed on the spin head 340 or when lifted from the spin head 340, the treating container 320 descends such that the spin head 340 protrudes upward from the treating container 320. Also, during processing, the height of the treating container 320 are controlled such that the treatment liquid flows into the predetermined collecting container 360 depending on a kind of treatment liquid supplied in substrate W. Selectively, the elevator unit 360 may move the spin head 340 up and down.

Figure 3:
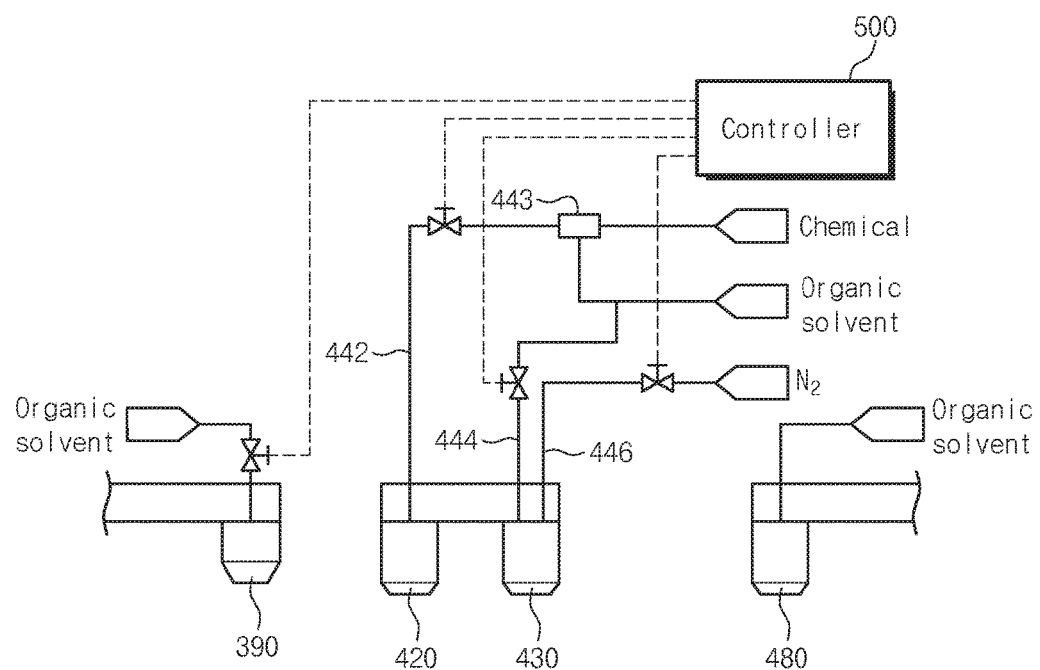
FIG. 3 shows a liquid supply unit of FIG. 2.
Figure 4:
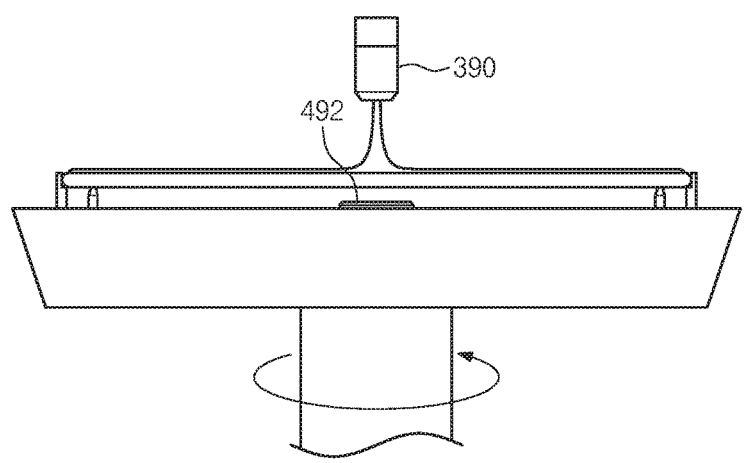
FIGS. 4 to 7 are cross sectional views of a substrate treating process using a liquid supply unit of FIG. 2.
Figure 5:
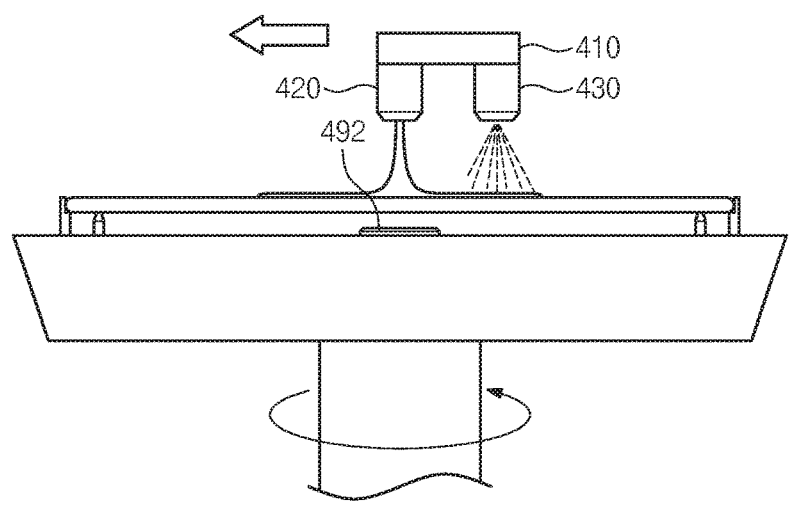
Figure 6:
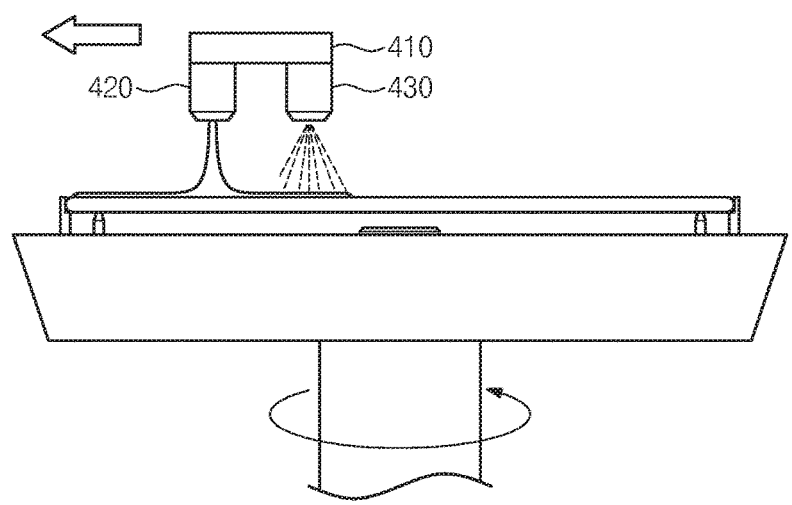
Figure 7:
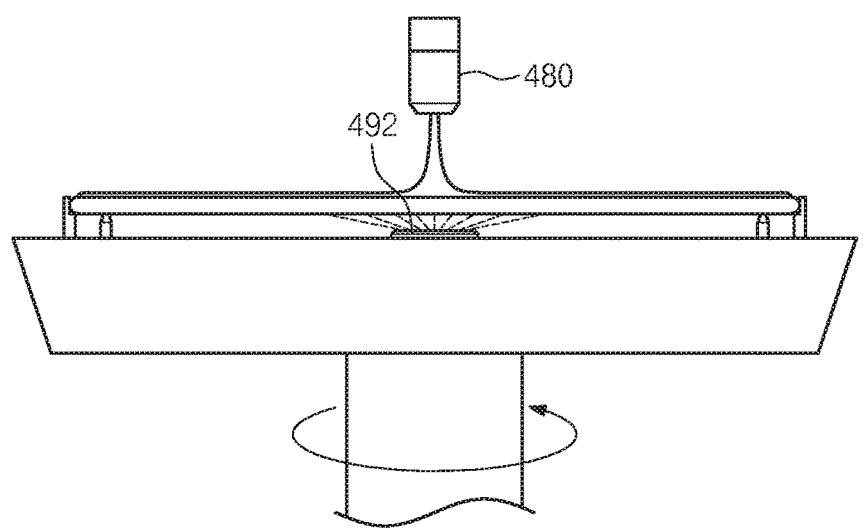
Figure 8:
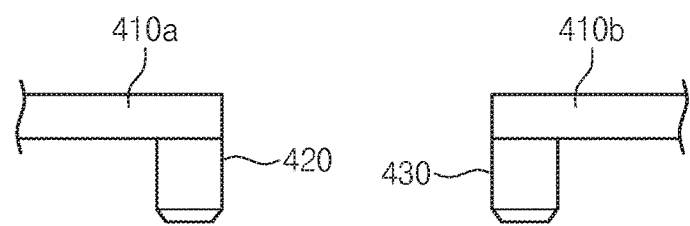
FIG. 8 is a cross sectional view of another embodiment of a liquid supply unit of FIG. 3.

The liquid supply unit supplies a treatment liquid to the substrate W. FIG. 3 shows a liquid supply unit of FIG. 2. Referring to FIGS. 2 and 3, the liquid supply unit 380 comprises a pre-treating member 380, a cleaning treating member 400, and a dry treating member 460.

The pre-treating member 380 supplies a pre-wet liquid on the substrate W. the pre-treating member 380 includes a nozzle moving member 381 and a pre-treating nozzle 390.

The nozzle moving member 381 moves the pre-treating nozzle 390 to a processing position and a standby position. The processing position is where the pre-treating nozzle 390 is oppose to the substrate W supported on the substrate supporting unit 340, and the standby position is where the pre-treating nozzle 390 is out of the processing position. The nozzle moving member 381 includes a supporting shaft 386, a support arm 382, and a driving member 388. The supporting shaft 386 is position on one side of the treating container 320. The supporting shaft 386 has a load shape such that its lengthwise direction is parallel with the third direction 16. The supporting shaft 386 is provided rotatable by the driving member 388. The support arm 382 is coupled to upper end of the supporting shaft 386. The support arm 382 is extended vertically from the supporting shaft 386. The pre-treating nozzle 390 is fixedly coupled to an end of the support arm 382. As the supporting shaft 386 rotates, the pre-treating nozzle 390 may move swinging with the support arm 382. The pre-treating nozzle 390 may be moved to the processing position and the standby position by swinging. When viewed from a top side, the pre-treating nozzle 390 may be placed to match with the center shaft of the substrate W from the processing position. For example, the pre-wet liquid may be organic solvent of a surfactant. Organic solvent may be IPA. The pre-wet liquid may convert the hydrophobic filmed formed on the substrate W to wet state.

Selectively, the supporting shaft 386 may be provided to be elevated. Also, the support arm 382 may be provided to move forward and backward to its lengthwise direction.

The cleaning treating member 400 supplies the first liquid and the second liquid on the substrate W. The cleaning treating member 400 includes a nozzle moving member 410, a first nozzle 420, and a second nozzle 430.

The nozzle moving member 410 moves the first nozzle 420 and the second nozzle 430 to the processing position and the standby position at the same time. The nozzle moving member 410 has the same shape with the nozzle moving member 381 and thereby detailed explanation is omitted. Each of the first nozzle 420 and the second nozzle 430 are fixedly installed on the support arm. A relative position of the first nozzle 420 and the second nozzle 430 is fixedly position to each other. The nozzle moving member 410 may move the first nozzle 420 and the second nozzle 430 for a first area supplied with the first liquid and a second area supplies with the second liquid may move between the center and the end of the substrate W.

The first nozzle 420 supplies the first liquid and the second nozzle 430 supplies the second liquid. The first liquid and the second liquid are discharged with different ways from each other. The first liquid may be discharged with dropping way and the second liquid may be discharged with mist way. The second area where the second liquid is supplied on the substrate may be included within the first area where the first liquid is supplied on the substrate. That is, the second liquid may be discharged with mist way on a liquid film formed by the first liquid. A discharge area of the second liquid may be provided smaller or the same with the liquid film formed by the first liquid. Each of the first liquid and the second liquid is provided as a liquid including organic solvent. For example, the first liquid may be provided as organic solvent and a mixture mixed with chemical, and the second liquid may be provided as organic solvent. Organic solvent may be a liquid including IPA and chemical may be a liquid having alkali property. Chemical may be a mixture mixed with $H_2O_2$, $NH_3$, and $H_2O$. the organic solvent may take up more than 50% of the volume of the first liquid.

Selectively, the chemical may be a liquid having acid property. However, in order to clean particles less than micro size remained on the substrate W, the first liquid having alkali property may be used rather than the first liquid having acid property. This may clean the particles less than micro size using zeta-potential of alkali liquid easily than the acid liquid. For example, the micro size may be 90 nm.

Also, the first liquid and the second liquid may be provided as mixtures mixed with organic solvent and chemical, respectively.

The second liquid discharged with mist way may remove particles remained and generated on the hydrophobic film by physical force. The mist way may be used from one of a two-fluid way, a minute discharge hole way, and a piezoelectric element way. In here, the two-fluid way may mix the second liquid with a pressure gas. The minute discharge hole way may discharge the second liquid from the discharge hole having plurality of fine diameters. The piezoelectric element way may discharge the second liquid by permitting vibration. In the embodiment, the second liquid explained as discharged with two-fluid way. The second liquid is discharged with larger discharge pressure than the first liquid. The mist way discharging the second liquid from the second nozzle 430 is easier than the dropping way for discharging the first liquid to remove particles above micro size. For example, the micro size may be 90 nm.

The liquid supply member supplies the first liquid to the first nozzle 420, and supplies the second liquid to the second nozzle 430. The liquid supply member includes an organic solvent storage, a chemical storage, a gas storage, a first liquid supply line 442, a second liquid supply line 444, and a gas supply line 446. The first liquid supply line connects the organic solvent storage and the chemical storage to the first nozzle 420. A first mixture member is installed on the first liquid supply line. The first mixture member mix organic solvent and chemical. Selectively, organic solvent and chemical may be in-line mixed during supplied through the first liquid supply line. The second liquid supply line 444 connects the organic solvent storage to the second nozzle 430. The gas supply line 446 connects the gas storage to the second nozzle 430. A gas stored in the gas storage is supplied to the second nozzle 430 through the gas supply line 446. Gas pressurizes the second liquid provided in the second nozzle 430. The pressurized second liquid may be discharged with mist way. For example, gas may be noble gas. The noble gas may be $N_2$ gas.

The dry treating member 460 supplies dry fluid on the treatment surface of the substrate W. According to an embodiment, the treatment surface of the substrate W may be upper surface of the substrate W. The dry treating member 460 includes a nozzle moving member 470, a dry nozzle 480, a heating nozzle 492, a heating supply line 494, and a heater 496. The nozzle moving member 470 moves the dry nozzle 480 to the processing position and standby position. The nozzle moving member 470 has the same shape to the nozzle moving member 381 and thereby detailed explanation is omitted. For example, the dry fluid may be organic solvent. The organic solvent may be IPA.

The heating nozzle 492 supplies a heating liquid to non-treatment surface of the substrate W. The non-treatment surface of the substrate W may be bottom surface of the substrate W. The heating nozzle 492 is installed in the center of the upper surface of the spin head 340. The heating nozzle 492 is provided such that its outlet protrudes to upward. The heating supply line 494 is connected to the heating nozzle 492. The heating supply line 494 supplies heating liquid to the heating nozzle 492. The heater 496 is installed in the heating supply line 494. The heater 496 treats the heating liquid with heat. For example, the heating liquid may be pure. The heater 496 may increase the temperature of the substrate W by treating the heating liquid higher than the room temperature with heat.

The controller 500 controls the liquid supply unit. The controller 500 performs a pre-wetting stage, cleaning treatment stage, and a drying treatment stage sequentially. The controller 500 controls pre-treating member to supply pre-wet liquid to the hydrophobic film formed on the substrate W in the pre-wetting stage. The controller 500 controls pre-treating member to supply the first liquid and the second liquid to the hydrophobic film formed on the substrate W in the cleaning treatment stage. The controller 500 supplies a dry liquid to the treatment surface of the substrate W in the drying treatment stage, and controls the dry treating member for the heating liquid to be supplied to non-treatment surface of the substrate W. According to an embodiment, in the cleaning treatment stage a liquid film may be formed on the substrate by the first liquid and the second liquid may be discharged on the liquid film. The first liquid may be supplied continuously while the second liquid is supplied.

Hereinafter explains a process for cleaning the substrate W using the substrate treating apparatus described above. The embodiment explains a method for treating a hydrophobic film formed on the substrate W with cleaning process. In the embodiment, the hydrophobic may be SiCN, ULK (Ultra Low-K), and LK (Low-K) which may be deposited with BEOL (Back End of Line) process.

FIGS. 4 to 7 are cross sectional views of a substrate treating process using a liquid supply unit of FIG. 2. Referring to FIGS. 4 to 7, when the pre-wetting stage is performed the substrate W is rotated by the substrate supporting unit 340, and the pre-treating nozzle 390 is moved from the standby position to the processing position. The pre-treating nozzle 390 supplies pre-wet liquid to the center of the substrate W. The pre-wet liquid is spread from the center of the substrate W to entire area. The hydrophobic film formed on the substrate W is changed such that its surface is wet. When the pre-wetting stage is finished, the cleaning treatment stage is performed.

In the cleaning treatment stage, the first liquid is supplied then the second liquid is supplied. The first liquid is continuously supplied while the second liquid is supplied. A liquid film is formed on the substrate by the first liquid and the second liquid is discharged on the liquid film. A discharge area which is the second area where the second is supplied is included within the liquid film formed by the first liquid.

When the cleaning treatment stage is processed, the pre-treating nozzle 390 is moved to the standby position, and the first nozzle 420 is moved to be opposed to the center of the substrate W. Thereby when viewed from a top side, the second nozzle 430 is placed in a position deviated from the center of the substrate W. The first nozzle 420 discharges the first liquid with a dropping way, and moved swinging by the nozzle moving member 410. a liquid film is formed on the substrate by the first liquid, and the liquid film is formed to be further apart from the center of the substrate W. the liquid film is formed to radial direction. For example, particles less than 90 nm remained on the substrate W may be removed by the first liquid. The second nozzle 430 is moved along a path where the first nozzle 420 is moved. When viewed from a top side, the second nozzle 430 is placed latter end of the moving direction of the first nozzle 420. Therefore, a discharge area where the second liquid is discharged is overlapped with the liquid film by the first liquid. Since the second liquid is discharged with mist way, particles over 90 nm remained on the substrate W may be removed. While the first liquid and the second liquid is discharged the first are and the second are may move once from the center of the substrate to its end and may move back and forth. When the cleaning treatment stage is finished, the drying treatment stage is performed.

When the drying treatment stage is processed, the first nozzle 420 and the second nozzle 430 are moved to the standby position, and the dry nozzle 480 is moved to the processing position. The heating nozzle 492 supplies heating liquid to a bottom surface of the substrate W before discharging dry liquid. Thereby the temperature of the substrate W is treated with higher temperature than the room temperature. After certain time passes, the dry nozzle 480 supplies the dry liquid to upper surface of the substrate W. Temperature of the dry fluid increases by the temperature of the substrate W. Consequently, surface tension of the dry fluid may be decreased and its evaporation rate may be increased.

In the above embodiment, the first nozzle 420 and the second nozzle 430 are explained as their relative positions are fixed as they are fixed to the one support arm 410. However, like FIG. 8, the first nozzle 420 and the second nozzle 430 may be driven independently by coupling to the supporting arms 410a, 410b, respectively.

What is claimed is:

1. A wet treating method comprising:
   pre-wetting a surface of a substrate containing a hydrophobic film with a pre-wet liquid to convert the hydrophobic film to a wet state;
   after pre-wetting the substrate, treating a first area of the substrate with a first cleaning liquid to form a liquid film on the substrate; and
   while treating the first area of the substrate, treating a second area of the substrate with a second cleaning liquid, the second area overlapping the first area.

2. The method of claim 1, wherein the treating the substrate with the first cleaning liquid includes,
   discharging first cleaning liquid in a first manner, the first manner including forming a liquid film on the substrate, and
   wherein the treating the substrate with the second cleaning liquid includes,
   discharging the second cleaning liquid in a second manner, different from the first manner, the second manner including discharging the second cleaning liquid as a mist.

3. The method of claim 2, wherein the second cleaning liquid is discharged on the liquid film.

4. The method of claim 1, wherein each of the first cleaning liquid and the second cleaning liquid include an organic solvent.

5. The method of claim 4, wherein the hydrophobic film includes at least one selected from the group consisting of Lk (Low-K), ULK (Ultra Low-K), and SiCN, and wherein the organic solvent includes IPA.

6. The method of claim 4, wherein the first cleaning liquid includes a mixture of hydrogen peroxide, ammonia, water, and the organic solvent, and wherein the organic solvent is more than 50% by volume of the first cleaning liquid.

7. The method of claim 1, wherein the treating the second area of the substrate with the second cleaning liquid includes one of,
   discharging the second cleaning liquid through a discharge hole, and
   discharging the second cleaning liquid with a piezo-electric element, the piezo-electric element inducing vibration in the second cleaning liquid.

8. The method of claim 1, wherein the second area is within the first area.

* * * * *